(12) United States Patent
Rolfson

(10) Patent No.: US 6,187,690 B1
(45) Date of Patent: *Feb. 13, 2001

(54) METHODS OF MANUFACTURING SEMICONDUCTIVE WAFERS AND SEMICONDUCTIVE MATERIAL STENCIL MASKS

(75) Inventor: J. Brett Rolfson, Boise, ID (US)

(73) Assignee: Micron Technology, Inc., Boise, ID (US)

(*) Notice: Under 35 U.S.C. 154(b), the term of this patent shall be extended for 0 days.

This patent is subject to a terminal disclaimer.

(21) Appl. No.: 09/483,719

(22) Filed: Jan. 13, 2000

Related U.S. Application Data

(63) Continuation of application No. 08/916,818, filed on Aug. 22, 1997, now Pat. No. 6,025,278.

(51) Int. Cl.[7] .................. H01L 21/302; H01L 21/461; B44C 1/22
(52) U.S. Cl. .............................. 438/745; 216/12
(58) Field of Search ................................ 438/745; 216/12

(56) References Cited

U.S. PATENT DOCUMENTS

| | | | |
|---|---|---|---|
| 4,013,502 | 3/1977 | Staples | 427/595 |
| 4,664,762 | 5/1987 | Hirata | 205/656 |
| 4,919,749 | 4/1990 | Mauger et al. | 216/12 |
| 5,110,373 | 5/1992 | Mauger | 148/33.2 |
| 5,167,778 | 12/1992 | Kaneko et al. | 205/656 |
| 5,173,149 | 12/1992 | Nojiri et al. | 205/644 |
| 5,338,416 | 8/1994 | Micak et al. | 205/643 |
| 5,578,167 | 11/1996 | Sooriakumar et al. | 438/745 |
| 5,622,636 | 4/1997 | Huh et al. | 438/5 |
| 6,025,278 | * 2/2000 | Rolfson | 438/745 |

OTHER PUBLICATIONS

Atsushi Ogura, Control of Thickness Variation in Si–on–Insulator Bonded Wafers by Applying Voltage during KOH Etching, Jpn. J. Appl. Phys., vol. 35 (1996), pp. L71–L73.

Ben Kloeck, Study of Electrochemical Etch–Stop for High–Precision Thickness Control of Silicon Membranes, IEEE Transactions on Electron Devices, vol. 36, No. 4, Apr. 1989, pp. 663–669.

* cited by examiner

Primary Examiner—Benjamin L. Utech
Assistant Examiner—Lynette T. Umez-Eronini
(74) Attorney, Agent, or Firm—Wells, St. John, Roberts, Gregory & Matkin

(57) ABSTRACT

In one aspect, the invention includes a method for manufacturing a semiconductive wafer comprising: a) providing a semiconductive material wafer having a front surface and a back surface; b) contacting the front surface with a first fluid; c) contacting the back surface with a second fluid different than the first fluid, at least one of the first and second fluids being configured to etch the semiconductive material of the wafer; at least one of the first and second fluids having a measurable component at a first concentration which is different than any concentration of said measurable component in the other of the first and second fluids; d) etching the semiconductive wafer with the at least one of the first and second fluids configured to etch the semiconductive material; and e) monitoring the measurable component concentration in at least one of the first fluid or the second fluid to ascertain if the etching has formed an opening extending completely through the substrate. In another aspect, the invention includes a method for manufacturing a semiconductive material stencil mask comprising: a) providing a semiconductive material stencil mask substrate having a front surface and a back surface; b) contacting the front surface with an inert solution having a first pH; c) contacting the back surface with an etchant having a second pH, the second pH being different than the first pH; and d) monitoring the pH of at least one of the inert solution or the etchant to ascertain if the etchant has formed an opening extending completely through the substrate.

28 Claims, 2 Drawing Sheets

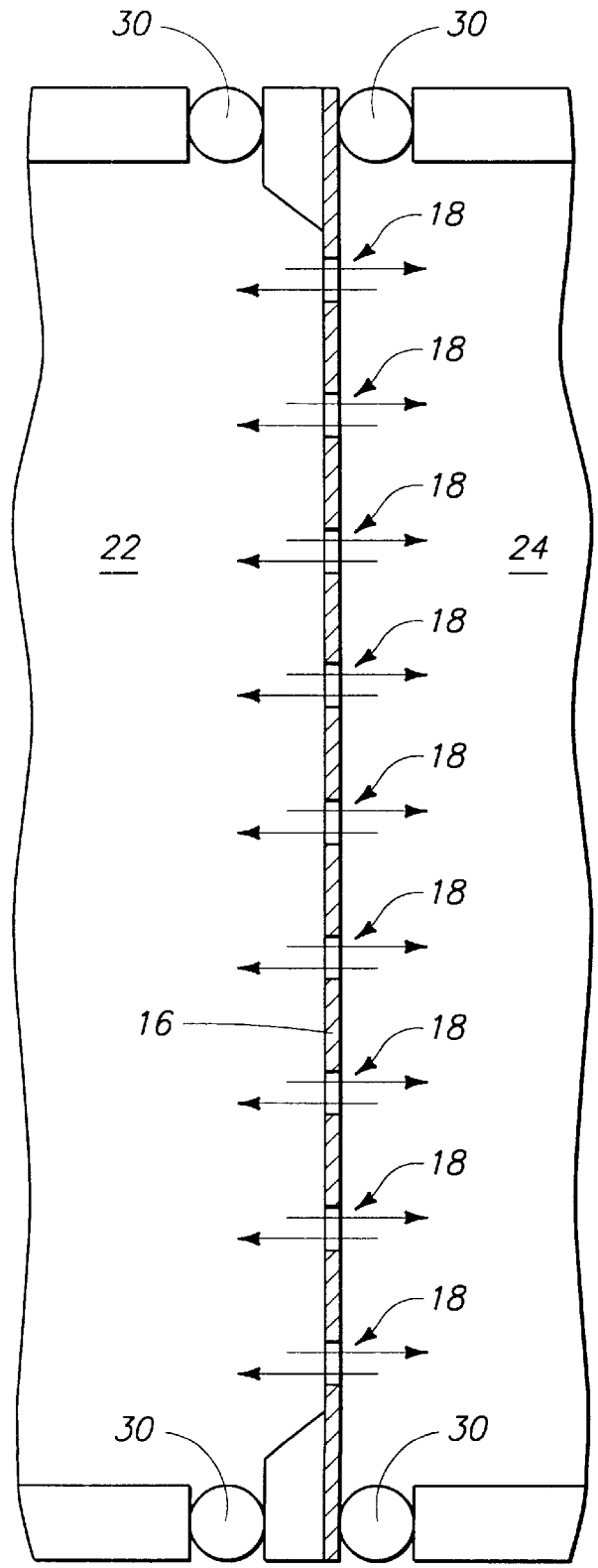

METHODS OF MANUFACTURING SEMICONDUCTIVE WAFERS AND SEMICONDUCTIVE MATERIAL STENCIL MASKS

RELATED PATENT DATA

This patent resulted from a continuation application of U.S. application Ser. No. 08/916,818, filed on Aug. 22, 1997 now U.S. Pat. No. 6,025,278.

TECHNICAL FIELD

The invention pertains to methods of manufacturing semiconductive wafers and to methods of manufacturing semiconductive material stencil masks.

BACKGROUND OF THE INVENTION

Ion and electron beam lithographic systems utilize a stencil mask to pattern a resist coated target. These stencil masks typically comprise a substrate and a pattern of openings formed through the substrate. Commonly, the substrate will be formed of silicon. However, other deposited or grown materials, such as SiC, SiN and BN can also be used to form portions of the substrate.

The formation of a pattern of openings extending through substrates comprising silicon, SiC, SiN and/or BN can be quite challenging as such substrates are frequently thin and brittle. Accordingly, it would be desirable to develop alternative methods of forming a pattern of openings within such substrates.

SUMMARY OF THE INVENTION

The invention pertains to a novel method of forming stencil masks. The invention pertains particularly to methods of forming openings in semiconductive materials and to methods of determining if such openings extend entirely through a semiconductive material.

In one aspect, the invention encompasses a method for manufacturing a semiconductive wafer. A semiconductive material wafer having a front surface and a back surface is provided. The front surface is contacted with a first fluid. The back surface is contacted with a second fluid different than the first fluid. At least one of the first and second fluids is configured to etch the semiconductive material of the wafer. At least one of the first and second fluids has a measurable component at a first concentration which is different than any concentration of said measurable component in the other of the first and second fluids. The semiconductive wafer is etched with at least one of the first and second fluids configured to etch the semiconductive material. The measurable component concentration is monitored in at least one of the first and second fluids to ascertain if the etching has formed an opening extending completely through the substrate.

In another aspect, the invention encompasses a method for manufacturing a semiconductive material stencil mask. A semiconductive material stencil mask substrate having a front surface and a back surface is provided. The front surface is contacted with a substantially inert solution having a first pH. The back surface is contacted with an etchant having a second pH. The second pH is different than the first pH. The pH of at least one of the inert solution or the etchant is monitored to ascertain if the etchant has formed an opening extending completely through the substrate.

In another aspect, the invention encompasses a method for manufacturing a semiconductive material stencil mask. A semiconductive material wafer having a front surface and a back surface is provided. One of the front surface or the back surface is contacted with an inert liquid solution. An other of the front surface or the back surface is contacted with an etchant liquid solution. At least one of the inert liquid solution or the etchant liquid solution has a measurable component at a first concentration which is different than any concentration of said measurable component in an other of the inert liquid solution or the etchant liquid solution. The measurable component concentration in at least one of the inert solution or the etchant liquid solution is monitored to ascertain if the etchant liquid solution has formed an opening extending completely through the substrate.

In another aspect, the invention encompasses a method for manufacturing a semiconductive material stencil mask. A semiconductive material stencil mask substrate having a front surface and a back surface is provided. An n-type conductivity enhancing dopant is provided proximate the front surface of the substrate. Openings are etched into the front surface and through the n-type conductivity enhancing dopant. The front surface is contacted with an inert solution. The back surface is contacted with an etchant. A positive potential is applied to the front surface. A negative potential is applied to the back surface. Etching is conducted through the back surface and to the openings. The etchant solution and inert solution mix after the etchant etches to the openings. A chemical characteristic of the etchant or the inert solution is monitored to determine approximately when the etchant mixes with the inert solution.

In another aspect, the invention encompasses a method for manufacturing a semiconductive material stencil mask. A semiconductive material stencil mask substrate having a front surface and a back surface is provided. An n-type conductivity enhancing dopant is provided proximate the front surface of the substrate. Openings are etched into the front surface and through the n-type conductivity enhancing dopant. The front surface is contacted with an inert solution. The back surface is contacted with an etchant. A positive potential is applied to the front surface. A negative potential is applied to the back surface. An etch is conducted through the back surface and to the openings. The etchant solution and inert solution mix after the etchant etches to the openings. A current between the front surface of the substrate and the back surface of the substrate is monitored. The current changes after the etchant solution mixes with the inert solution.

BRIEF DESCRIPTION OF THE DRAWINGS

Preferred embodiments of the invention are described below with reference to the following accompanying drawings.

FIG. 3 is an expanded view of a wafer in the FIG. 2 processing apparatus showing the wafer at a processing step subsequent to that of FIG. 2.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
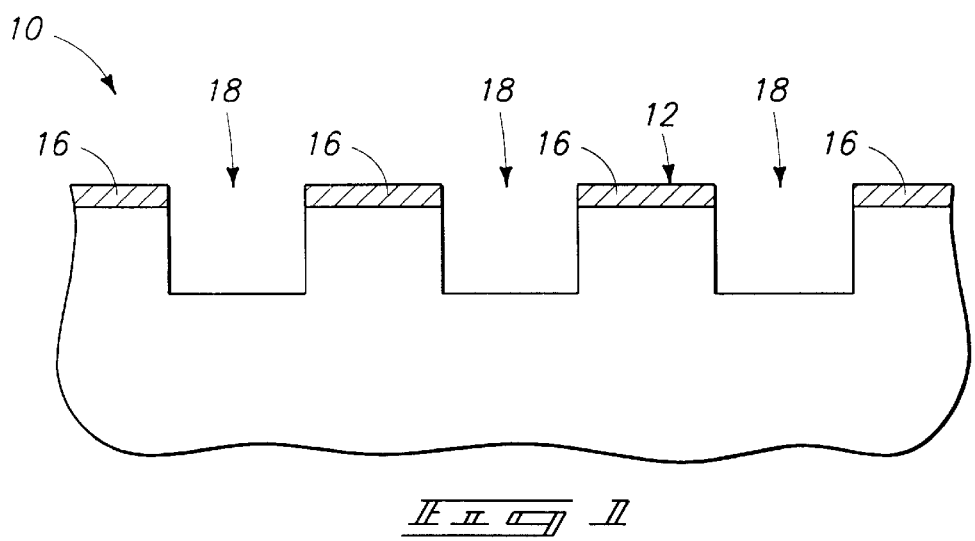
FIG. 1 is a fragmentary diagrammatic cross-sectional view of a semiconductor wafer being processed according to a method of the present invention.

A process for forming a stencil mask from a semiconductive wafer is described with reference to FIGS. 1–3. Referring to FIG. 1, a fragment of a stencil mask substrate 10 is illustrated at a preliminary processing step of a stencil mask fabrication process. Substrate 10 may comprise, for example, monocrystalline silicon. Preferably, if substrate 10 comprises monocrystalline silicon, it will be lightly and uniformly doped with a p-type dopant. A typical uniform dopant concentration will be from about $10^{12}$ to about $10^{16}$ atoms/cm$^3$.

Substrate 10 comprises a front surface 12 and a back surface 14 (FIG. 2), and typically comprises a thickness of about 675 microns. An n-type region 16 is formed proximate front surface 12 by providing an n-type conductivity enhancing dopant within region 16. A suitable n-type conductivity-enhancing dopant can comprise, for example, arsenic or phosphorous. The n-type conductivity-enhancing dopant is preferably provided to a concentration of about $10^{17}$ atoms/cm$^3$ or greater and to a depth of from about 2 to about 10 micrometers into wafer fragment 10. N-type region 16 can be formed by conventional methods, such as, for example, by implanting.

Openings 18 are provided through front surface 12 and through n-type regions 16. Openings 18 can be formed by conventional methods, such as, for example, etching. Openings 18 define a masking pattern to ultimately be formed within stencil mask substrate 10.

Figure 2:
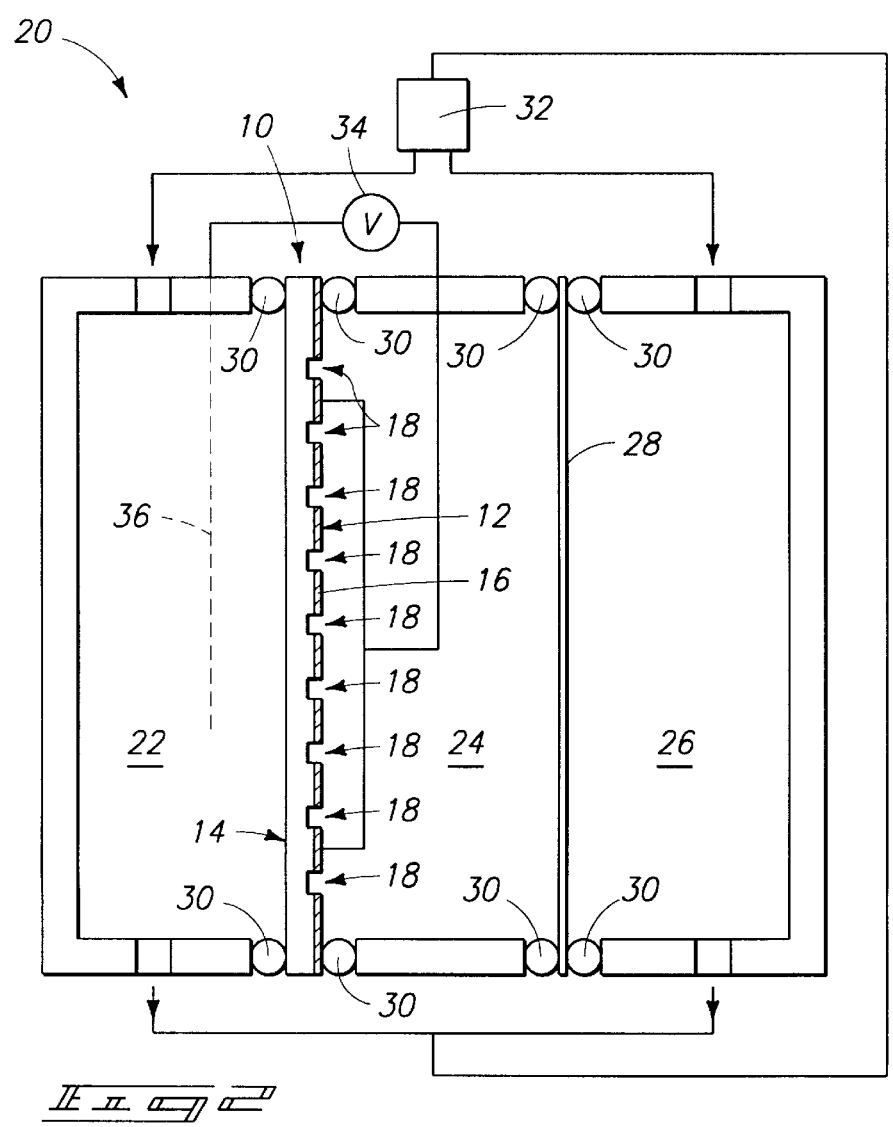
FIG. 2 is a diagrammatic cross-sectional view of a wafer processing apparatus of the present invention showing a semiconductor wafer at a preliminary processing step.

Referring to FIG. 2, wafer substrate 10 is inserted into a processing apparatus 20. Processing apparatus 20 comprises three chambers 22, 24 and 26. An etchant fluid flows through chambers 22 and 26, while an inert fluid is kept within chamber 24. The etchant fluid may comprise a gas or a liquid, and will preferably comprise a solution of potassium hydroxide. The inert fluid can comprise a gas or liquid, and will preferably comprise deionized water in a liquid form. Wafer 10 separates the etchant fluid of chamber 22 from the inert fluid of chamber 24, and a flexible membrane 28 separates the inert fluid in chamber 24 from the etchant fluid in chamber 26. O-rings 30 are provided to maintain fluid-tight seals adjacent substrate 10 and membrane 28. Apparatus 20 is constructed to maintain substantially the same pressure on both front surface 12 and back surface 14 of wafer 10. Such same pressure can alleviate breakage of wafer 10 as the wafer is exposed to processing within apparatus 20. As will become apparent below, however, the claimed method of the present invention may be utilized with a number of apparatuses in addition to the apparatus 20 shown in FIG. 2. Apparatus 20 merely represents an exemplary and preferred apparatus for utilization of the process of the present invention.

Wafer 10 is preferably oriented such that back surface 14 contacts the etchant solution in chamber 22 and front surface 12 contacts the inert solution in chamber 24.

In a preferred method of operation, a potassium hydroxide solution is flowed through chambers 22 and 26 such that the etchant potassium hydroxide contacts back surface 14. The potassium hydroxide solution can flow from and to a potassium hydroxide solution reservoir 32. Preferably, a voltage is applied from a voltage source 34 to generate a potential difference between the etchant solution in chamber 22 and front side 12 of wafer 10. Accordingly, an electrode 36 will preferably be inserted within chamber 22. Electrode 36 can comprise, for example, platinum. A negative potential is applied to electrode 36 and thereby to the potassium hydroxide solution in chamber 22. A positive potential is applied to front surface 12. The potassium hydroxide solution etches the lightly p-type doped silicon until it reaches the n-type doped region whereupon an electrochemical process causes etching to substantially terminate. However, as openings 18 extend through region 16, the potassium hydroxide etching will not terminate until after reaching openings 18.

FIG. 3 shows an expanded view of substrate 10 within apparatus 20 (shown in FIG. 2) after etching for a sufficient time for the etchant to reach region 16. Openings 18 now extend entirely through substrate 10 such that the solutions within chambers 22 and 24 mix.

It is desired to identify approximately when the etching of substrate 10 reaches openings 18. Such identification enables technicians monitoring apparatus 20 to accurately ascertain when etching of wafer 10 is substantially complete, and therefore when wafer 10 can be removed from apparatus 20 and a new wafer inserted. Also, although the processing method described above substantially terminates after etching to openings 18 and before etching through front surface 12, other methods can be used with the present invention which may not so substantially terminate. In utilizing such other methods, it would be advantageous to ascertain about when an etchant reaches openings 18 so that the etching process can be terminated before the etching proceeds through front surface 12. Accordingly, the present invention encompasses methods of determining if the etchant solution in chamber 22 has reached openings 18.

In one aspect, the invention includes monitoring a current between front surface 12 of substrate 10 and either back surface 14 of substrate 10 or a solution within chamber 22. It has been found that, for instance, in the process described above with reference to FIGS. 2 and 3 wherein a potassium hydroxide solution is utilized as an etchant and an n-type region 16 is provided at the front surface of a substrate 10, a current between front surface 12 and back surface 14 will spike when the potassium hydroxide solution reaches n-type region 16. It is thought that this spike is due to oxide forming on the n-type doped semiconductive material when the material is exposed to potassium hydroxide. At constant voltage, the current decreases after an initial spike as the formed oxide layer achieves a thickness which substantially terminates further growth of the oxide layer.

In another aspect, the invention encompasses providing a measurable component at a first concentration in either the etchant fluid or the inert fluid which is different from any concentration of said measurable component in the other of the etchant fluid and the inert fluid. The measurable component concentration is then monitored in at least one of the etchant fluid and the inert fluid to ascertain if the inert solution and etchant solution are mixing. As discussed above, such mixing occurs after the etchant solution etches to openings 18. The measurable component may be initially provided only within one of the etchant fluid or the inert fluid, or may be initially provided at differing concentrations within the etchant fluid and the inert fluid. As discussed in more detail below, the monitoring of the measurable component concentration may comprise manual measurements, substantially automated measurements, and/or substantially continuous measurements of the measurable component concentration in at least one of the etchant fluid or the inert fluid.

Example measurable components which can be utilized in the method of the present invention are hydrogen ions and hydroxide ions. For instance, if the etchant fluid comprises potassium hydroxide and the inert fluid comprises deionized water, the hydroxide ion concentration of the etchant fluid will be higher than that of the inert fluid. Correspondingly, the hydrogen ion concentration of the etchant fluid will be lower than that of the inert fluid. Once that etching reaches openings 18 and the inert fluid mixes with the etchant fluid, the pH of the inert fluid will rise and the hydroxide ion concentration of the etchant fluid will go down. Methods for detecting hydrogen ion concentration, or hydroxide ion concentration, include pH monitoring devices, such as pH probes. Accordingly, one or more pH probes may be inserted in contact with at least one of the etchant solution and the inert solution and monitored to ascertain when mixing occurs between the etchant solution and the inert solution.

Alternative methods for detecting hydrogen ion concentration, or hydroxide ion concentration, include pH indicator components such as pH sensitive dyes. Thus, one or more pH sensitive dyes may be inserted within the etchant solution or the inert solution and monitored to ascertain when mixing occurs between the solutions. Suitable pH sensitive dyes include, for example, congo red and phenolphthalein. Phenolphthalein is typically utilized to indicate a basic solution and congo red is typically utilized to indicate an acidic solution. Accordingly, if a basic etchant, such as potassium hydroxide, is utilized it may be desirable to mix phenolphthalein with the inert fluid. When the basic etchant reaches openings :18 and mixes with the inert fluid, the color of the inert fluid will change to indicate the presence of the basic solution. On the other hand, if an acidic etchant solution is utilized, it may be desirable to mix congo red with the inert solution. The color of the inert solution will then change when the acidic etchant reaches openings 18 and mixes with the inert solution.

In another aspect, the invention encompasses providing a concentration of a colored reagent in at least one of the etchant fluid or the inert fluid which is different from any concentration of the colored reagent in the other of the etchant fluid or the inert fluid. For instance, a food coloring dye may be added to one of the inert solution or the etchant solution and not to the other. The color of the inert solution and the etchant solution could then be visually monitored to ascertain when the inert solution mixes with the etchant solution. Upon mixing, the intensity of the color within the solution that initially contained the greater concentration of the colored reagent would decrease while the intensity of color in the solution that initially had a lower concentration, or none, of the colored reagent would increase. Alternatively, a colored reagent having a first color could be provided in one of the etchant solution or the inert solution, and a colored reagent having a second color different from the first color could be provided in the other of the etchant solution or the inert solution. The color of either or both of the etchant solution and the inert solution could then be monitored to ascertain when mixing occurs between the etchant solution and the inert solution. For instance, if the etchant solution were provided with a blue colored reagent and the inert solution were provided with a red colored reagent, both solutions would turn purple after the etchant solution etched to openings 18 and the solutions mixed.

The above-described procedures can be accomplished either manually or automatically. For instance, a pH of the etchant solution could be continuously and automatically monitored by flowing the solution through a pH detection system after flowing the solution through chamber 22. Also, a pH of the inert solution could be continuously and automatically monitored by inserting a pH probe into chamber 24. Additionally, a color of the etchant solution could be continuously and automatically monitored by flowing the solution through a spectroscopic device after flowing the solution through chamber 22. Alternatively, a window could be provided into chamber 22 through which a spectroscopic device continuously and automatically monitored a color of the fluid within chamber 22. Further, the color of an inert solution could be monitored by either flowing a portion of the inert solution through a spectroscopic device or by providing a window into chamber 24 through which a spectroscopic device could detect a color of the fluid within chamber 24.

It is noted that many chemical characteristics of the etchant or the inert solution can be utilized for the method of the present invention. Any chemical characteristic which differs between the etchant and the inert solution at the initiation of an etching process can be utilized for the present invention provided that the chemical characteristic can be detected. Once the etchant solution reaches openings 18 and the etchant solution and the inert solution mix, it is expected that such chemical characteristic would become more intense in the solution that initially had less or none of the chemical characteristic, and less intense in the solution that initially had the majority of the chemical characteristic. Accordingly, the present invention encompasses monitoring for a number of chemical characteristics in addition to those discussed specifically above.

It is also noted that the present invention encompasses other processes besides the process 20 illustrated in FIG. 2. For instance, in some etching processes it may not be necessary to provide a voltage difference between a front side of a wafer and a back side of a wafer. An example of such processes is to provide a wafer which is heavily doped with a p-type dopant proximate a front surface of the wafer and lightly doped with p-type dopant throughout the remainder of the wafer. Openings are provided through the region proximate the front surface and into the lightly doped region. The wafer is etched with a potassium hydroxide solution without providing a potential difference across the wafer. A rate of the etching slows when the potassium hydroxide solution reaches the heavily doped region proximate the front surface of the wafer.

Another example etching process in which it may not be necessary to provide a voltage difference between a front side of a wafer and a back side of the wafer is as follows. A wafer is provided which is doped with a p-type dopant proximate a front surface of the wafer and doped with an n-type dopant throughout the remainder of the wafer. Openings are provided through the region proximate the front surface and into the n-type doped region. The wafer is then etched with a potassium hydroxide solution without providing a potential difference across the wafer. The rate of the etching slows when the potassium hydroxide solution reaches the p-type doped region proximate the front surface of the wafer.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for manufacturing a semiconductive wafer comprising: providing a semiconductive material wafer having a front surface and a back surface;

contacting the front surface with a fluid;

contacting the back surface with an etchant solution;

etching through the back surface, the etchant solution and fluid mixing after the etchant etches an opening completely through the wafer.

2. The method of claim 1 further comprising providing a p-type dopant throughout the semiconductive material wafer, the p-type dopant being provided to a concentration less than a concentration of a n-type conductivity enhancing dopant provided proximate the front surface.

3. The method of claim 1 wherein the etchant solution comprises a basic pH.

4. The method of claim 1 wherein the semiconductive material wafer is etched to form a stencil mask.

5. The method of claim 1 wherein the fluid and the etchant are gases.

6. The method of claim 1 wherein the fluid and the etchant are liquids.

7. The method of claim 1 further comprising, before the etching with the etchant solution;

providing a conductivity enhancing dopant proximate the front surface of the wafer; and forming openings into the front surface and through the conductivity enhancing dopant, and wherein the etching slows when the etchant reaches the conductivity enhancing dopant.

8. The method of claim 1 further comprising, before the etching with the etchant solution:

providing a conductivity enhancing dopant proximate the back surface of the wafer; and forming openings into the front surface and into the conductivity enhancing dopant, and wherein the etching slows when the etchant passes through the conductivity enhancing dopant.

9. A method for manufacturing a semiconductive wafer comprising: providing a semiconductive material wafer having a front surface and a back surface;

contacting the front surface with a first fluid;

contacting the back surface with a second fluid different than the first fluid, at least one of the first and second fluids being configured to etch the semiconductive material of the wafer; at least one of the first and second fluids having a measurable characteristic, other than pH, that has a different value than any value of said measurable characteristic in the other of the first and second fluids;

etching the semiconductive wafer with the at least one of the first and second fluids configured to etch the semiconductive material; and monitoring the measurable characteristic value in at least one of the first fluid or the second fluid to ascertain etch depth.

10. The method of claim 9 wherein the semiconductive material wafer is etched to form a stencil mask.

11. The method of claim 9 wherein the first and second fluids are gases.

12. The method of claim 9 wherein the first and second fluids are liquids.

13. The method of claim 9 wherein the monitoring comprises a substantially automated measurement of the measurable characteristic value in at least one of the first fluid or the second fluid.

14. The method of claim 9 wherein the monitoring comprises a substantially continuous measurement of the measurable characteristic value in at least one of the first fluid or the second fluid.

15. The method of claim 9 wherein the etching of the wafer with at least one of the first and second fluids consists essentially of etching with the second fluid, the method further comprising, before the etching with the second fluid:

providing a conductivity enhancing dopant proximate the front surface of the wafer; and forming openings into the front surface and through the conductivity enhancing dopant, and wherein the etching with the second fluid slows when the second fluid reaches the conductivity enhancing dopant.

16. The method of claim 9 wherein the etching of the wafer with at least one of the first and second fluids consists essentially of etching with the second fluid, the method further comprising, before the etching with the second fluid:

providing a conductivity enhancing dopant proximate the back surface of the wafer; and forming openings into the front surface and into the conductivity enhancing dopant, and wherein the etching with the second fluid slows when the second fluid passes through the conductivity enhancing dopant.

17. A method for manufacturing a semiconductive wafer comprising: providing a semiconductive material wafer having a front surface and a back surface;

contacting the front surface with a first fluid;

contacting the back surface with a second fluid different than the first fluid, at least one of the first and second fluids having a measurable characteristic that has a different value than any value of said measurable characteristic in the other of the first and second fluids and the first and second fluids converging after an opening is formed extending completely through the substrate; and monitoring the measurable characteristic value in at least one of the first fluid or the second fluid to ascertain if an opening has formed extending completely through the substrate.

18. The method of claim 17 wherein the semiconductive material wafer is etched to form a stencil mask.

19. The method of claim 17 wherein the first and second fluids are gases.

20. The method of claim 17 wherein the first and second fluids are liquids.

21. The method of claim 17 wherein the monitoring comprises a substantially automated measurement of the measurable characteristic value in at least one of the first fluid or the second fluid.

22. The method of claim 17 wherein the monitoring comprises a substantially continuous measurement of the measurable characteristic value in at least one of the first fluid or the second fluid.

23. The method of claim 17 wherein the forming an opening consists essentially of etching with the second fluid, the method further comprising, before the etching with the second fluid:

providing a conductivity enhancing dopant proximate the front surface of the wafer; and forming openings into the front surface and through the conductivity enhancing dopant, and wherein the etching with the second fluid slows when the second fluid reaches the conductivity enhancing dopant.

24. The method of claim 17 wherein the forming an opening consists essentially of etching with the second fluid, the method further comprising, before the etching with the second fluid:

providing a conductivity enhancing dopant proximate the back surface of the wafer; and forming openings into the front surface and into the conductivity enhancing dopant, and wherein the etching with the second fluid slows when the second fluid passes through the conductivity enhancing dopant.

25. The method of claim 17 wherein the measurable characteristic comprises hydrogen ions concentration.

26. The method of claim 17 wherein the measurable characteristic comprises a visible component.

27. The method of claim 17 wherein the measurable characteristic comprises a spectroscopically detectable indicator.

28. A semiconductive wafer processing method comprising:

providing a semiconductive material wafer having two opposing surfaces;

contacting one of said opposing surfaces with a first fluid and contacting the other of said opposing surfaces with a second fluid different than the first fluid, a measurable characteristic, other than pH, having a different value in one of the first and second fluids than the other of the first and second fluids;

etching the semiconductive wafer while contacting such wafer with the first and second fluids; and while etching, monitoring the measurable characteristic value in at least one of the first fluid or the second fluid to ascertain penetration of an opening through the semiconductive wafer.

* * * * *